United States Patent
Komatsu et al.

(10) Patent No.: US 9,796,052 B2
(45) Date of Patent: Oct. 24, 2017

(54) COMPOSITE NANOMETAL PASTE CONTAINING COPPER FILLER AND JOINING METHOD

(75) Inventors: Teruo Komatsu, Osaka (JP); Ryo Matsubayashi, Hanno (JP)

(73) Assignees: APPLIED NANOPARTICLE LABORATORY CORPORATION, Osaka-Fu (JP); SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 53 days.

(21) Appl. No.: 14/389,668

(22) PCT Filed: Mar. 30, 2012

(86) PCT No.: PCT/JP2012/058570
§ 371 (c)(1),
(2), (4) Date: Sep. 30, 2014

(87) PCT Pub. No.: WO2013/145258
PCT Pub. Date: Oct. 3, 2013

(65) Prior Publication Data
US 2015/0053753 A1    Feb. 26, 2015

(51) Int. Cl.
*B23K 35/00* (2006.01)
*B23K 35/22* (2006.01)
(Continued)

(52) U.S. Cl.
CPC .......... *B23K 35/025* (2013.01); *B22F 1/0018* (2013.01); *B22F 1/0062* (2013.01);
(Continued)

(58) Field of Classification Search
CPC .......... B22F 1/0018; B22F 9/30; B82Y 30/00; B23K 35/0244; B23K 35/025;
(Continued)

(56) References Cited

U.S. PATENT DOCUMENTS

2012/0220072 A1*  8/2012  Kim .................... H01B 1/22
                                                                  438/98

FOREIGN PATENT DOCUMENTS

JP           7-320535         12/1995
JP        P2004-107728 A      4/2004
(Continued)

*Primary Examiner* — Erin Saad
(74) *Attorney, Agent, or Firm* — DLA PIPER LLP (US)

(57) ABSTRACT

The present invention addresses the problem of providing a composite nanometal paste which is relatively low in price and is excellent in terms of bonding characteristics, thermal conductivity, and electrical property.
The present invention is a copper-filler-containing composite nanometal paste that contains composite nanometal particles each comprising a metal core and an organic coating layer formed thereon. The metal paste contains a copper filler and contains, as binders, first composite nanometal particles and second composite nanometal particles which differ from the first composite nanometal particles in the thermal decomposition temperature of the organic coating layer, wherein the mass proportion W1 of the organic coating layer in the first composite nanometal particles is in the range of 2-13 mass %, the mass proportion W2 of the organic coating layer in the second composite nanometal particles is in the range of 5-25 mass %, and these particles satisfy the relationships W1.

11 Claims, 5 Drawing Sheets

(51) Int. Cl.
*B23K 35/02* (2006.01)
*H01B 1/22* (2006.01)
*B22F 1/00* (2006.01)
*H01B 1/02* (2006.01)
*H05K 1/09* (2006.01)
*B23K 1/20* (2006.01)
*B23K 35/30* (2006.01)
*B23K 35/36* (2006.01)
*B22F 7/06* (2006.01)

(52) U.S. Cl.
CPC ................ *B22F 7/064* (2013.01); *B23K 1/20* (2013.01); *B23K 35/302* (2013.01); *B23K 35/3612* (2013.01); *H01B 1/026* (2013.01); *H01B 1/22* (2013.01); *H05K 1/092* (2013.01); *H05K 2201/0224* (2013.01); *H05K 2201/0257* (2013.01); *H05K 2201/0272* (2013.01)

(58) Field of Classification Search
CPC .................. B23K 35/24; C22C 1/0425; H05K 2201/0257; H05K 2201/0272
USPC ...... 228/262.9; 252/519.21; 148/22; 75/255, 75/246
See application file for complete search history.

(56) References Cited

FOREIGN PATENT DOCUMENTS

| | | |
|---|---|---|
| JP | P2010-50189 A | 3/2010 |
| JP | P4600282 | 12/2010 |
| JP | P2011-58041 A | 3/2011 |
| JP | P4680313 | 5/2011 |

\* cited by examiner

Thermal shock cycle : −55°C (30min) / +150°C (30min)

Thermal shock cycle : −40°C (30min) / +200°C (30min)

1.5 μm-Cu60%   Pressurization Pressure Dependence of Shear Strength

COMPOSITE NANOMETAL PASTE CONTAINING COPPER FILLER AND JOINING METHOD

FIELD OF THE INVENTION

The present invention relates to a composite nanometal paste containing composite nanometal particles in which a organic coating layer comprising organic matter is formed around a metal core, and particularly to the composite nanometal paste containing a metal filler together with said composite nanometal particles and a joining method using it.

BACKGROUND ART

Composite nanometal particles of ultrafine particles are developed as an electroconductive metal paste material that it is possible to be sintered with electroconductive material at low temperature in addition to high strength and superior electroconductivity and thermal conductivity, and in Japanese patent No. 4680313 (patent document 1), a part of the present inventors disclose the composite nanosilver particle. The composite nanosilver particle described in the patent document 1 has the organic coating layer derived from alcohol and contains metal ingredient in large quantities due to the considerable increasing of the silver core weight in comparison with conventional one.

However, in the nanometal particle comprising the composite nanometal particle having the organic coating layer or the noble metal, since it is difficult to perform mass-production and raw materials are expensive, the manufacturing cost of the metal paste containing the composite metal particle in large quantities increases, so that the application does not always progress.

As a method to solve such a problem, there is a trial in which metal pastes is developed by mixing the nanometal particle and the conventional metal particle. In Japanese Patent Laid-Open No. H7-320535 (patent document 2), it is described the electroconductive paste comprising metal ultra-fine particles such as silver, copper or copper-silver alloy and glass frit, where an average particle size of the metal ultra-fine particles exists in the range of 1 nm to 100 nm.

Furthermore, in Japanese patent No. 4600282 (Patent document 3), it is described the electroconductive paste containing metal powder comprising spherical type particle (A) in which an average particle diameter of primary particle is 0.1 to 1 μm and spherical type particle (B) in which average particle diameter of primary particle is not larger than 50 nm and said metal powder is selected among platinum, gold, silver, copper, nickel and palladium.

Average particle diameter is not s than 50 nm, and powder made up of silver fine particles including organic component and mean diameter are more than 50 nm, and, at Japanese Patent Laid-Open No. 2011-58041 bulletin (patent document 4), the paste which mixed powder made up of copper system fine particles including organic component with solvents is described. In patent document 4, the copper based fine particles also contain organic ingredient, and the silver based fine particles and the copper based fine particles are produced by the pyrolysis control method in absence of solvent under the presence of an amine compound. Namely, in the patent document 4, a commercial copper powder larger than micron size is not used, and a copper based fine particle of nano size to submicron size is produced by the method same as the silver based fine particle, and the particles has much organic ingredient.

[Patent Document 1] Japanese patent No. 4680313
[Patent Document 2] Japanese Patent Laid-Open No. H7-320535
[Patent Document 3] Japanese patent No. 4600282
[Patent document 4] J Japanese Patent Laid-Open No. 2011-58041

DISCLOSURE OF THE INVENTION

Problems to be Solved by the Invention

In the patent document 2, as indicated previously, it is described the electroconductive paste comprising metal ultra-fine particles such as silver and copper or copper-silver alloy powder, where the average particle size of metal ultra-fine particles exists within the range of 1 nm to 100 nm. However, in the patent document 2, the electroconductivity paste is sintered in temperature higher than 400° C. under the nitrogen atmosphere and is evaluated. Namely, it is considered that the electroconductive paste which can withstands practical use is not obtained in temperature lower than 400° C., and actually, it is not described evaluations of performance to the sintering in temperature lower than 400° C. under the atmosphere. In other words, even if the ultra-fine metal particle and the copper or the copper-silver alloy powder are simply mixed, in the ultra-fine metal particle, an advantage of low temperature sintering have not been utilized efficiently. According to an experiment by the present inventors, when a semiconductor element is joined due to the sintering in temperature higher than 350° C. by using the electroconductive paste, an electrode and a insulating film of the semiconductor element change in quality, so that a characteristic of the semiconductor element deteriorates after sintering. The low temperature sintering in temperature lower than 350° C. is desirable to restrain the characteristic deterioration in the semiconductor element.

In the patent document 3, as indicated previously, it is described the electroconductive paste containing metal powder comprising the spherical type particle (A) in which the average particle diameter of primary particle is 0.1 to 1 μm and the spherical type particle (B) in which the average particle diameter of primary particle is not larger than 50 nm, and the spherical type particle (A) is a particle such as copper and the spherical type particle (B) is a particle such as silver. In the patent document 3, the paste is applied to a glass substrate and is sintered at 500° C. As the result, the volume resistivity of 3 μΩ·cm is obtained. Namely, in order to obtain the objective performance, the sintering at 500 is necessary, and the evaluation concerning the joining strength is not performed quantitatively.

As described earlier, in the patent document 4, it is described the paste in which the powder of the silver based fine particles containing the organic ingredient and the powder of the copper based fine particles containing the organic ingredient are mixed in solvents. Namely, the commercial copper powder larger than micron size is not used, and the copper based fine particle of nano size to submicron size is produced by the method same as the silver based fine particle and contains the organic ingredient. However, the commercial copper powder larger than micron size is not used, so that the manufacturing cost increases, and since the copper based fine particle also contains the organic ingredient, in the paste, the content of the organic ingredient increases, so that the electrical characteristic and the joining strength have decreased.

Accordingly, in the present invention, first purpose is to provide a composite nanometal paste that it is possible to give the superior joining strength, the superior thermal conductivity and the superior electroconductivity by the low temperature sintering because of containing the metal particle which is relatively low price and is superior in the joining strength and the thermal conductivity as a filler material, where the composite nanometal particle is contained and the organic ingredient ratio is set to relatively low. Furthermore, it is difficult to use a large quantity of the conventional composite nanometal paste by mass-production because of the producing cost and the characteristic, but in the present invention, second purpose is to provide a composite nanometal paste having the paste characteristic and the practicability and to provide a joining method of thing such as module due to the use thereof by improving the paste characteristic, realizing low cost and industrial mass-production.

Means to Solve the Problems

The present invention was completed to solve the above problem, and the first form of the present invention is a copper-filler-containing composite nanometal paste comprising a composite nanometal particle in which an organic coating layer being an organic matter is formed around a metal core, and a copper filler which has not said organic coating layer, wherein as binders, said composite nanometal particle comprises first composite nanometal particle and second composite nanometal particle which differs from said first composite nanometal particle in a pyrolysis temperature of said organic coating layer, a mass ratio W1 of said organic coating layer in said first composite nanometal particle exists within a range of 2 to 13 mass %, a mass ratio W2 of said organic coating layer in said second composite nanometal particle exists within a range of 5 to 25 mass %, and when T1 is a pyrolysis temperature of said organic coating layer that covers said first composite nanometal particle and T2 is a pyrolysis temperature of said organic coating layer that covers said second composite nanometal particle, the relationships T1<T2 and W1<W2 are satisfied.

The second form of the present invention is the copper-filler-containing composite nanometal paste of the first form, wherein a relationship of N1<N2 is satisfied where N1 is a carbon number of said organic matter included in said first composite nanometal particle and N2 is a carbon number of said organic matter included in said second composite nanometal particle.

The third form of the present invention is the copper-filler-containing composite nanometal paste of the second form, wherein said carbon number N1 is selected from a range of 1 to 6, and said carbon number N2 is selected from a range of 7 to 12.

The fourth form of the present invention is the copper-filler-containing composite nanometal paste of the first to third forms, wherein a metallic element forming said metal core is selected from one or more kinds among Ag, Au, Pt, Ru, Zn, Sn and Ni.

The fifth form of the present invention is the copper-filler-containing composite nanometal paste of any one of the first to fourth forms, wherein said copper filler is contained in a range of 10 mass % to 90 mass % of total mass.

The sixth form of the present invention is the copper-filler-containing composite nanometal paste of any one of the first to fourth forms, the organic matter is a copper filler component composite nanometal paste chosen among higher than kind of an alcohol derivative guided by alcohol molecule, a cutting residue of alcohol molecule and alcohol molecule.

The seventh form of the present invention is the copper-filler-containing composite nanometal paste of any one of the first to sixth forms, wherein an addition agent comprising a viscosity grant agent and/or a viscosity adjustment solvent is added, and an addition amount of said addition agent is determined by a ratio of a total amount of organic matter containing in said composite nanometal particle and all metal ingredient.

The eighth form of the present invention is the copper-filler-containing composite nanometal paste of any one of the second to seventh forms, wherein third composite nanometal particle in which an organic coating layer comprising an organic matter of carbon number N3 is formed around said metal core is additionally contained, a mass ratio W3 of said organic coating layer in said third composite nanometal particle is not more than 0.2 mass %, said carbon number N3 satisfies a relationship N3<N2, and a pyrolysis temperature T3 of said organic coating layer satisfies a relationship T3<T2.

The ninth form of the present invention is a joining method according to any one of the first to eighth forms, said joining method comprising the steps of forming a paste layer by applying said copper-filler-containing composite nanometal paste between joined members, and sintering said paste layer by heating or heating with pressurization to join said joined members.

The tenth form of the present invention is the joining method of the ninth form, wherein a sinter layer formed by sintering said paste layer absorbs a deformation caused due to difference of thermal expansion coefficients in said joined members.

The tenth form of the present invention is the joining method of the ninth or tenth form, wherein said joined members comprise first copper specimen and second copper specimen, and a shear strength with which said first copper specimen and said second copper specimen are joined is not less than 20 MPa, when a joining area of said first copper specimen is 5 mm $\phi$, a joining area of said second copper specimen is larger than 5 mm $\phi$, a heating temperature of said heating is not lower than 250° C. and said pressurization is not less than 5 MPa.

Effects of the Invention

According to the present invention, in the case industrially mass-producing the composite nanometal paste which contains the composite nanometal particle forming the organic coating layer around metal core and the copper filler, it is possible to be mass-produced based upon the physical quantity which can easily evaluate characteristic of the composite nanometal paste. Namely, in the composite nanometal particle, the pyrolysis temperature T of the organic coating layer can be specified by the mass ratio W (mass %) of organic coating layer in the composite nanometal particle because of correlating with the average particle diameter. In the first form of the present invention, the mass ratio W1 of said organic coating layer exists within the range of 2 to 13 mass % in said first composite nanometal particle and the mass ratio W2 of said organic coating layer exists within the range of 5 to 25 mass % in said second composite nanometal particle, and the pyrolysis temperature T1 of said organic coating layer and the pyrolysis temperature T2 of said organic coating layer are set so that the relationships T1<T2 and W1<W2 are satisfied. Accordingly, since the first composite nanometal particle and the second composite nanometal particle are contained as the binder and the copper filler having the large particle diameter is contained as the aggregate, the strong binding power after sintering is obtained and the total amount of organic matter to the metal ingredient decreases, so that it is possible to provide the composite nanometal paste having a preferable paste characteristic. In other words, in the metal paste, the total amount of organic matter is set less than the predetermined value, it is possible to obtain the composite nanometal paste having the preferable paste characteristic In the following, effects in each form of the present invention is explained in more detail.

According to the first form of the present invention, the composite nanometal paste (in the follow, "metal paste" also is described) containing the copper filler comprises the copper filler which does not have an organic coating, and as binders, said first composite nanometal particle and said second composite nanometal particle which differs from said first composite nanometal particle in the pyrolysis temperature of said organic coating layer, and when T1 is the pyrolysis temperature of said organic coating layer that covers said first composite nanometal particle and T2 is a pyrolysis temperature of said organic coating layer that covers said second composite nanometal particle, the relationships T1<T2 and W1<W2 are satisfied, so that after the organic coating layer of the first composite nanometal particle begins the thermal pyrolysis or after said organic coating layer begins the thermal pyrolysis, the organic coating layer of the second composite nanometal particle can be pyrolyzed. Namely, at first, the part or the whole of the first composite nanometal particle is sintered, so that said copper filler is bound, and the part or the whole of the second composite nanometal particle is sintered, so that said copper filler and said first composite nanometal particle can be bound. Therefore, a sintered body which has higher strength and preferable electroconductivity can be formed. In particular, when two joined members are joined, it is possible to join said joined members in a relatively lower temperature and a short time.

Furthermore, according to the first form, the mass ratio W1 of said organic coating layer in said first composite nanometal particle exists within the range of 2 to 13 mass % and the mass ratio W2 of said organic coating layer in said second composite nanometal particle exists within the range of 5 to 25 mass %, and the relationship W1<W2 is satisfied, so that when the paste is mixed and dispersed, said second composite nanometal particle has dispersibility better than said first composite nanometal particle and can contribute to dispersibility of said first composite nanometal particle. In the composite nanometal particle, when the mass ratio of organic coating layer becomes larger, the dispersibility becomes preferable, and since said second composite nanometal particle disperses preferably than said first composite nanometal particle, said metal fine particle and said first composite nanometal particle are bound by sintering of said second composite nanometal particle, so that high strength and preferable electro conductivity are given. In addition, since the mass ratio W1 is not more than 13 mass % and the mass ratio W2 is not more than 25 mass %, the ratio of the organic matter content in each composite nanometal paste can be reduced comparably. Therefore, most of the organic ingredient can be removed by heating, so that the preferred electroconductivity is given. Furthermore, when said mass ratio W1 becomes less than 2 mass %, the dispersibility reduces, so that the function of said first composite nanometal particle as binder falls. In addition, when the mass ratio W2 becomes less than 5 mass %, the dispersibility reduces, and when the second composite nanometal particle also starts the sintering in the temperature higher than the first composite nanometal particle, the function as the binder can not be shown.

Accordingly, the copper filler of relatively low price is contained as the aggregate, and said first composite nanometal particle and said second composite nanometal particle are contained, so that it is possible to provide the copper filler containing composite nanometal paste which is lower cost and high performance.

According to the second form of the present invention, since the relationship of the carbon number N1 and the carbon number N2 satisfies N1<N2 where N1 is the carbon number of said organic matter contained in said first composite nanometal particle and N2 is the carbon number of the organic matter contained in said second composite nanometal particle, in said organic coating layers, it can be relatively easily adjusted that a relationship of mass ratios W1 and W2 becomes W1<W2 and a relationship the pyrolysis temperature T1 and T2 becomes T1<T2. Namely, the mass ratio of the organic coating layer and the pyrolysis temperature thereof depend on the carbon number of said organic matter, so that the mass ratio of organic coating layer increases by increasing the carbon number, and then it is possible to rise the pyrolysis temperature. It is preferable that difference of the carbon numbers N1 and N2 is not less than 2, and it is more preferable that the said difference is not less than 4.

According to the third form of the present invention, since said carbon number N1 is selected from the range of 1 to 6 and said carbon number N2 is selected from the range of 7 to 12, it is possible to be adjusted so that the relationship of the mass rations W1 and W2 becomes W1<W2 and the relationship of the pyrolysis temperature T1 and T2 becomes T1<T2. As described earlier, when the mass ratio of organic coating layer increases by increasing the carbon number, it is possible to rise the pyrolysis temperature. In the case that the mass ratio W1 of organic coating layer becomes too much in the first composite nanometal particle, since the content of organic matter in the metal paste increases, said carbon number N1 is selected from the range of 1 to 6, so that it is possible to suppress the content of organic matter. It is demanded that the second composite nanometal particles are dispersed more surely in the metal paste, and said carbon number N2 is selected from the range of 7 to 12. As described earlier, it is preferable that difference of the carbon numbers N1 and N2 is not less than 2, and it is more preferable that the said difference is not less than 4.

According to the forth form of the present invention, since the metallic element forming said metal core is selected from one or more kinds among Ag, Au, Pt, Ru, Zn, Sn and Ni, said composite nanometal particle functions as preferred binder, so that it is possible to form the sintered body of metal paste which has high strength, satisfactory thermal conductivity and preferable electroconductivity.

According to the fifth form of the present invention, since said copper filler is contained in the range of 10 mass % to 90 mass % of total mass, the organic matter content is set within the preferred range. In the metal paste, the ratio of organic matter ingredient is controlled and the predetermined content of the copper filler without the organic coating layer is contained, so that after sintering, it is possible to form the sintered body of metal paste which has high strength, satisfactory thermal conductivity and preferable electroconductivity. In the case that said copper filler in the total mass is less than 10 mass %, since the ratio of organic matter content is large, it becomes difficult to almost completely release said pyrolyzed ingredient of organic matter. For example, in the case that the joined members are joined, it becomes more difficult to release the pyrolyzed ingredient, and when said copper filler is not less than 10 mass % of total mass, it is possible to realize perform the preferred joining. Furthermore, when the content ratio of composite nanometal particle is set in less than the predetermined quantity, the manufacturing cost of metal paste can be reduced.

In addition, when the copper filler exceeds 90 mass % of total mass, the content ratio of composite nanometal particle contained as binder decreases, so that it is difficult to be preferably sintered. Furthermore, it is more preferable that said copper filler exists within the range of 15 mass % to 85 mass % of total mass.

According to the sixth form of the present invention, since said organic matter is selected from one or more kinds among the alcohol molecule, the cut residue of alcohol molecule and the alcohol derivative derived from the alcohol molecule, it is relatively easy to adjust the mass ratios W1 and W2 and the carbon numbers N1 and N2 in the organic coating layers of the first composite nanometal particle and the second composite nanometal particle. Therefore, it becomes easy to adjust the pyrolysis temperatures T1 and T2. For example, as described in the patent document 2, in the case that the organic metallic compound is dispersed in the alcohol solvent and is reacted by heating, it is not needed to add the reducing agent, and it is possible to obtain the desired composite nanometal particle due to the kind and the carbon number of the alcohol.

According to the seventh form of the present invention, the addition agent comprising the viscosity grant agent and/or the viscosity adjustment solvent is added, and the addition amount of said addition agent is determined by the ratio of the total amount of organic matter containing in said composite nanometal particle and all metal ingredient, so that the metal ingredient ratio of the metal paste concerning the present invention is kept in high ratio and it is possible to suppress the content ratio of organic matter ingredient. Furthermore, since the addition agent comprising the viscosity grant agent and/or the viscosity adjustment solvent is added, it is easy to perform handling such as mix or application of metal paste.

According to the eighth form of the present invention, since the third composite nanometal particle in which the organic coating layer comprising the organic matter of carbon number N3 is formed around said metal core is additionally contained and the pyrolysis temperature T3 of said organic coating layer satisfies the relationship T3<T2, three kinds of the composite nanometal particles are sintered, so that it is possible to improve the strength, the electroconductivity and the thermal conductivity. Since the mass ratio W3 of said organic coating layer in said third composite nanometal particle is not more than 0.2 mass % and said carbon number N3 satisfies the relationship N3<N2, the ratio of organic matter content can decrease in the metal paste concerning the eighth form.

In addition, when the metal core of third composite nanometal particle comprises the copper element, the high thermal conductivity and the electroconductivity in the copper can be given to sintered body of the metal paste by being sintered with the copper filler.

According to the ninth form of the present invention, in the joining method concerning any one of the first to eighth forms, since said joining method comprises the steps of forming a paste layer by applying said copper-filler-containing composite nanometal paste between joined members and sintering said paste layer by heating or heating with pressurization to join said joined members, the high strength, the satisfactory thermal conductivity and the preferred electroconductivity can be given between said joined members. Since the copper filler is contained, the high ratio of metal ingredient is given, and since the first and the second composite nanometal particles are contained as the binder and are sintered, the high thermal conductivity and the electroconductivity in the copper are given to the sintered body, so that it is possible to preferably join the joined members.

According to the tenth form of the present invention, because of absorbing the deformation caused due to the difference of thermal expansion coefficients in said joined members, in the thermal shock test described later, a superior result can be shown, and it is possible to markedly improve a joining characteristic of joined members.

According to the eleventh form of the present invention, said joined members comprise first copper specimen and second copper specimen, the joining area of said first copper specimen is 5 mm $\phi$, when the joining area of said second copper specimen is larger than 5 mm $\phi$ and the heating temperature of said heating is not lower than 250° C. under said pressurization being not less than 5 MPa, the shear strength with which said first copper specimen and said second copper specimen are joined is not less than 20 MPa, so that the practically preferable joining strength is given, and it is possible to join the joined members with a high strength in a relatively row temperature.

BEST MODE FOR CARRYING OUT THE INVENTION

Figure 1:
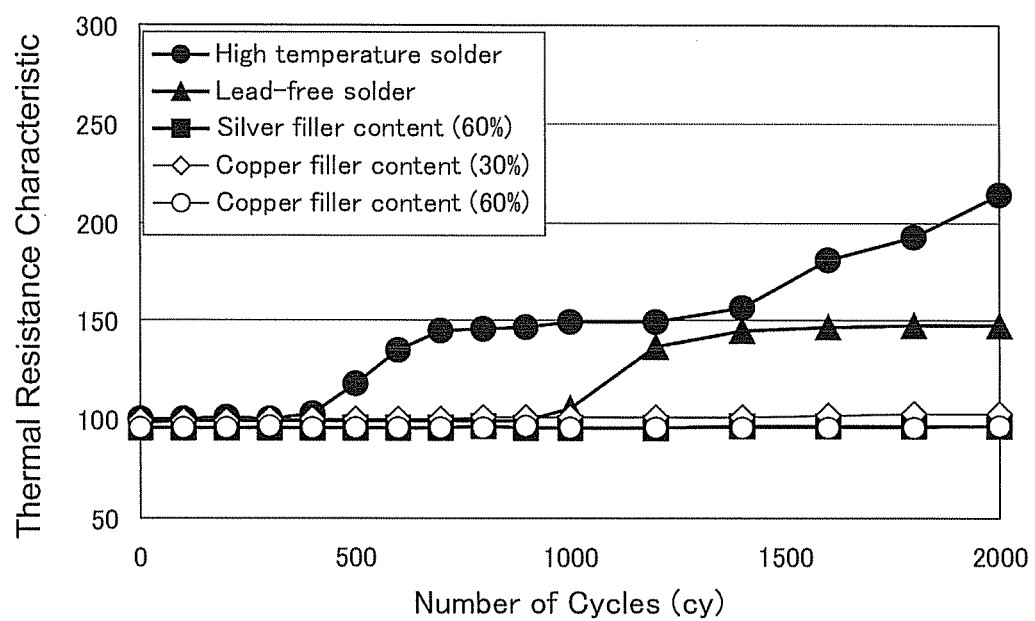
FIG. 1 is a graph diagram showing results of thermal shock test by a high-heat resistant power semiconductor which functions by setting an appropriate electrode structure, where a heat sink and a ceramic substrate (27×21 mm) are joined by using the copper-filler-containing composite nanometal paste concerning the present invention in the heating and the pressurizing, so that an electrical insulation layer is formed, and at an upper part thereof, Si semiconductor (9.0×8.4 mm) is joined with rigid by the same method and the same paste.

FIG. 1 is the graph diagram showing the results of thermal shock test of Si semiconductor module, where the heat sink and the ceramic substrate are joined by using the copper-filler-containing composite nanometal paste concerning the present invention in the heating and the pressurizing, so that the electrical insulation layer is formed, and at the upper part thereof, the Si semiconductor of 9.0 mm×8.4 mm is joined by using the same metal paste, so that the Si semiconductor module is produced. Namely, the heat sink, the ceramic substrate and the Si semiconductor are used as the joined members. In the case between the heat sink and the ceramic substrate and in the case between the ceramic substrate and the semiconductor, each sintering is performed for 180 seconds in the pressurization of 40 MPa by heating to 300° C. under the atmosphere. The horizontal axis is the number of cycles (cy) in which a cycle of module temperature comprises decreasing rapidly to −55° C., being held for 30 minutes, increasing rapidly to 150° C. and being held for 30 minutes, and the cycle of thermal-shock is repeated to 2000 times. The vertical axis is a thermal resistance characteristic showing a change amount of forward voltage before and after applying large pulse current in each thermal cycle, and if the temperature rise due to the forward voltage of semiconductor is effectively absorbed by the heat sink before and after applying the large pulse current, the change amount is small, so that it is given the characteristic being an index whether a joining structure preferable in the thermal conductivity is formed, and the thermal resistance characteristic is better as the value is smaller in each thermal shock. The thermal resistance characteristic is measured at room temperature, and the follow is normalized so that the initial value of high temperature solder described later becomes 100.

In the FIG. 1, the embodiments of the present invention are represented by sample names of "copper filler content (30%)" and "copper filler content (60%)". In the module which is joined by the pressure sintering (described by "heat press" in the figure) using the copper-filler-containing composite nanometal paste of the sample "copper filler content (30%)", it is shown that a mass ratio of copper filler in a total mass of metal paste used for joining is about 30 mass %. Similarly, the sample name of "copper filler content (60%)" shows that a mass ratio of copper filler in the metal paste is about 60 mass %. An average particle diameter of the copper filler is 1.5 µm. In the metal pastes of "copper filler content (30%)" and "copper filler component (60%)", as the first composite nanometal particle, there is used the composite nanometal particle which is produced from starting materials being hexanol and silver carbonate, and as the second composite nanometal particle, there is used the composite nanometal particle which is produced from starting materials being dodecanol and silver carbonate. Furthermore, the viscosity grant agent and the viscosity adjustment agent are contained within 5 to 7 mass % of total mass. As the viscosity grant agent, commercial thickeners can be used, and as the viscosity adjustment agent, higher alcohols may be used.

In the FIG. 1, as the comparative examples, a result of the module joined by the conventional lead-free solder for joining (Sn-3.0Ag-0.5Cu) is represented by "lead free solder", and a result of the module joined by the composite nanosilver paste containing silver filler (Applied Nanoparticle Laboratory Corporation) also is represented by "silver filler content (60%)". The composite nanosilver paste containing silver filler contains the silver filler of 60 mass % instead of the copper filler.

As shown in the FIG. 1, when the lead-free solder of the comparative example exceeds 1000 cycles, the thermal resistance characteristic suddenly rises. In the result shown in FIG. 1, when the module is joined by the silver filler content (60%) of the comparative example and the copper filler content (30%) or the copper filler content (60%) of the embodiment, it is shown that the thermal resistance characteristic almost does not change at 2000 cycles, so that it is found that the paste design is performed effectively.

Figure 2:
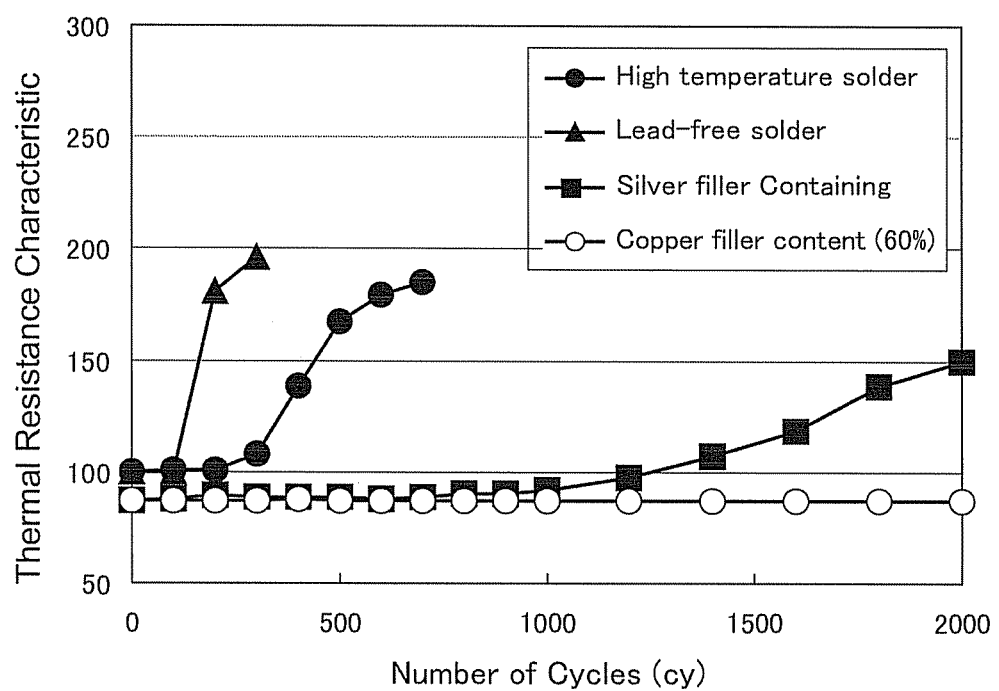
FIG. 2 is a graph diagram showing results of thermal shock test by a power semiconductor which functions by setting an appropriate electrode structure, where a heat sink and a ceramic substrate (27×21 mm) are joined by using the copper-filler-containing composite nanometal paste concerning the present invention in the heating and the pressurization, so that an electrical insulation layer is formed, and at an upper part thereof, Si semiconductor (9.0×8.4 mm) is joined with rigid by the same method and the same paste.

FIG. 2 is the graph diagram showing the results of the thermal shock test under higher temperature of 200° C. in the power semiconductor module produced by using Si (9×8.4 mm) as the power semiconductor. The heating temperature, the time and the joining condition under pressurization are same as the Si semiconductor, but the thermal shock condition differs, and the horizontal axis is the number of cycles (cy) in which a cycle of module temperature comprises decreasing rapidly to −40° C., being held for 30 minutes, increasing rapidly to 200° C. and being held for 30 minutes, and the cycle of high temperature thermal-shock is repeated to 2000 times. Similarly, the vertical axis is the thermal resistance characteristic which is the change amount of forward voltage before and after applying large pulse current in each thermal cycle, and the thermal resistance characteristic is better as the value is smaller in each thermal shock. The thermal resistance characteristic is measured at room temperature, same as FIG. 1, and is normalized so that the initial value of high temperature solder becomes 100.

As the embodiment of the present invention, similarly to the FIG. 1, FIG. 2 shows a test result of module joined by using the copper-filler-containing composite nanometal paste containing which is represented by the sample name of "copper filler content (60%)". As indicated previously, the metal paste used in the "copper filler content (60%)" contains the copper filler of about 60 mass % to the total mass of metal paste where the average particle diameter is 1.5 µm. Similarly, in the FIG. 2, as the comparative example, it is shown test results of modules which are joined by using each of the high temperature solder, the lead-free solder and the silver-filler-containing composite nanosilver paste ("silver filler containing"). In addition, said silver filler containing composite nanosilver paste is same as the paste described in the FIG. 1. Furthermore, in the copper-filler-containing composite nanometal paste used for "copper filler content (60%)" being the embodiment, the composite nanometal particle is contained and is produced by the production method same as FIG. 1.

In the FIG. 2, as compared with the joining by the high temperature solder or the lead-free solder, it is found that in the joining by the copper-filler-containing composite nanometal paste of "copper filler content (60%)", the thermal conductivity is superior because the initial value is 87 and small. In the thermal shock test, the lead-free solder same as the FIG. 1 is used, and when the high temperature side of thermal shock is changed from 50° C. to 200° C., the thermal resistance characteristic changes largely at 100 cycles, and in the high temperature solder, changes at 300 cycles. In the high temperature thermal shock test of the module joined by the silver-filler-containing composite nanosilver paste ("silver filler containing") being the comparative sample, in the case exceeding 1000 cycles, the thermal resistance characteristic begins to slightly rise, and then as result, it is suggested that the structural change is generated in the micro structure of joining state so as to obstruct the thermal conductivity. On the other hand, in the case that the module is joined by the copper-filler-containing composite nanometal paste ("copper filler content (60%)"), the same value as the initial value is shown at the 2000 cycles, so that it is indicated that the value of thermal resistance characteristic is not changed at all. Namely, it is found that the copper-filler-containing composite nanometal paste is not only effective because of low cost but the joining property also is superior to the solder and the silver-filler-containing composite nanosilver paste.

Furthermore, a working condition of Si power semiconductor does not become a design to withstand operation in high temperature environment of 200° C., but in the next generation power semiconductor, it is confirmed that it is possible to perform stable normal operations under high temperature environment of 200° C. by the next generation power semiconductor. In the point, it is shown that in the heat generation of element, it is shown that the superior thermal conductivity is assured by the joining due to the copper-filler-containing composite nanometal paste.

TABLE 1

| Particle Diameter (nm) | Packing Number of Atoms An (Number) | Surface Atom Number Asn (Number) | Organic Coating Group Gn (Number) | C12-Coating Amount (mass %) | C6-Coating Amount (mass %) |
|---|---|---|---|---|---|
| 20 | 245649 | 20619 | 5162 | 3.47 | 1.92 |
| 15 | 103633 | 11486 | 2873 | 4.53 | 2.53 |
| 10 | 30706 | 5006 | 1253 | 6.53 | 3.67 |
| 5 | 3838 | 1180 | 295 | 11.6 | 6.70 |
| 3 | 836 | 157 | 98 | 16.8 | 9.95 |
| 2 | 249 | 157 | 39 | 21.5 | 13.0 |
| 2 | 31 | 28 | 7 | 24.7 | 15.2 |

Table 1 is a calculation result estimating the mass ratio of organic coating layer in the composite nanometal particle concerning the present invention. In the case that it is assumed that the metal core is formed by silver atoms, since the crystal structure of silver single crystal is face-centered cubic lattice, the bulk density is 74%. The lattice constant of silver single crystal is $a=b=c=0.40862$ nm, $\alpha=\beta=\gamma=90°$, and the chemical unit number $Z=4$. Therefore, volume $Vg$ of one silver atom becomes the follow by calculation.

$$Vg = 0.74 \times 0.40862^3/4 = \text{about } 1.262 \times 10^{-2} \text{nm}^3$$

A sphere volume of radius r is $(4/3)\pi r^3$ and is regarded as about 4.19 r, and then radius $Rg$ of silver atom is calculated as follows from the value of said volume $Vg$.

$$Rg = (1.262 \times 10^{-2}/4.19)^{1/3} = 0.144 \text{nm}$$

When the metal core is assumed as a sphere of particle radius R, the packing number An of silver atoms in the sphere by the follow formula as the atomic packing factor of 74%.

$$An = 0.74 \times 4.19 R^3/Vg = 0.246 R^3 \quad (1)$$

Therefore, as shown in the Table 1, when the particle diameter is 20 nm, the particle radius R is 10 nm, and the packing number An of atoms becomes $An=246000$ from said formula (1). In the case being the particle diameter of 15 nm to 2 nm, the packing number An of atoms is shown in the Table 1. Furthermore, the thickness Ta of surface layer in the metal core sphere becomes Ta=2 Rg=0.288 nm, because the radius Rg of silver atom is Rg=0.144 nm. Volume Vs of said surface layer is calculated as follows.

$$Vs = 4.19(R^3 - (R-0.288)^3)$$

When the closest packing factor of this case also is 74%, the surface atom number Asn of the sphere surface is obtained by the follow formula using the volume Vg of said one silver atom and the volume Vs of said surface layer.

$$Asn = 0.74 Vs/Vg$$

Where since the organic group forming the organic coating layer has a volume, it is not considered that all of surface atoms existing on the sphere surface binds th organic groups. Accordingly, it is reasonably assumed that atoms neighboring to the silver atoms which bind the organic coating groups are not bound to the organic coating groups. Therefore, the organic coating groups are bound to ¼ of the surface atom number Asn, so that the organic coating group number Gn is expressed by the following formula.

$$Gn = Asn/4 \quad (2)$$

The value of the organic coating number Gn in a metal core sphere of 20 nm to 2 nm is calculated from the formula (2), and is described in the Table 1. When Avogadro's number $N_A$ is used, the molar number ng of the organic coating layer is represented by $ng=Gn/N_A$ and the molar number ns of the metal core sphere is expressed by $ns=An/NA$, and when the molecular weight of organic coating groups and the molecular weight of silver are assumed to be Mg and Ms, respectively, the mass ratio Mc of the organic coating layer comprising the organic coating groups is by the following formula.

$$Mc = ng \cdot Mg/(ng \cdot Mg + ns \cdot Ms) \quad (3)$$

In the case that the molecular weight Ms of silver is 108 g and the organic coating group is $C_{12}H_{25}O$, the molecular weight Mg (C12) is 185 g. In addition, when the organic coating group is $C_6H_{13}O$, the molecular weight Mg (C6) is 101 g. The calculated result of said formula (3) by using their values is shown in the Table 1, where the case that the organic coating ground is $C_{12}H_{25}O$ is represented as "C12-coating amount" and the case that the organic coating ground is $C_6H_{13}O$ is represented as "C6-coating amount".

As shown in the Table 1, in the "C12-coating amount" that the organic coating group is $C_{12}H_{25}O$, it is found that when the particle diameter is 20 nm to 1.5 nm, the mass ratio of organic coating layer becomes about 25 mss % to 3 mass %. In the composite nanometal particle produced by using dodecanol and silver carbonate as starting materials (represented by "C12 nanosilver particle" as follows), it is confirmed that the particle diameter is several nanometers nm, and it is found that it is possible to be coated to the mass ratio of organic coating layer about 25 mass %. The mass ratio of organic coating layer is measured by the thermal analysis measurement (TG-DTA), and said C12 nanosilver particle indicates preferable dispersibility not less than 5 mass % and indicates more preferable dispersibility not less than 8 mass %. Namely, in the C12 nanosilver particle, it is preferred that the mass ratio exists within 25 mass % to 5 mass %, and when the mass ratio of organic coating layer is exceeded, it is considered that the organic ingredient ratio I too much, and the metal ingredient ratio of metal paste decreases.

As shown in the Table 1, it is found that the "C6-coating amount" in which the organic coating group is $C_6H_{13}O$ has the particle diameter of 20 nm to 1.5 nm and the mass ratio of organic coating layer is 15 mass % to 2 mass %. In the composite nanometal particle produced by using hexanol and silver carbonate as starting materials (represented by "C6 nanosilver particle" as follows), it is confirmed that the particles of average particle diameter which is not larger than 20 nm can be produced. In the "C6 nanosilver particle" of Table 1, the mass ratio of 20 nm becomes 1.92 mass %, and in the particle diameter of 20 nm to 1.5 nm, the mass ratio becomes about 2 mass % to 15 mass %. The C6 nanosilver particle can be produced in the price lower than the C12 nanosilver particle, and it is preferred that the content is lager than the C12 nanosilver particle and the C12 nanosilver particle is contained so as to be relatively little. Accordingly, when the mass ratio of organic coating layer exceeds 13 mass %, the ratio of organic ingredient is too much, so that the ratio of metal ingredient in the metal paste decreases. Namely, it is preferred that the mass ratio of organic coating layer in the C6 nanosilver particle exists within 2 mass % to 13 mass %.

Figure 3:
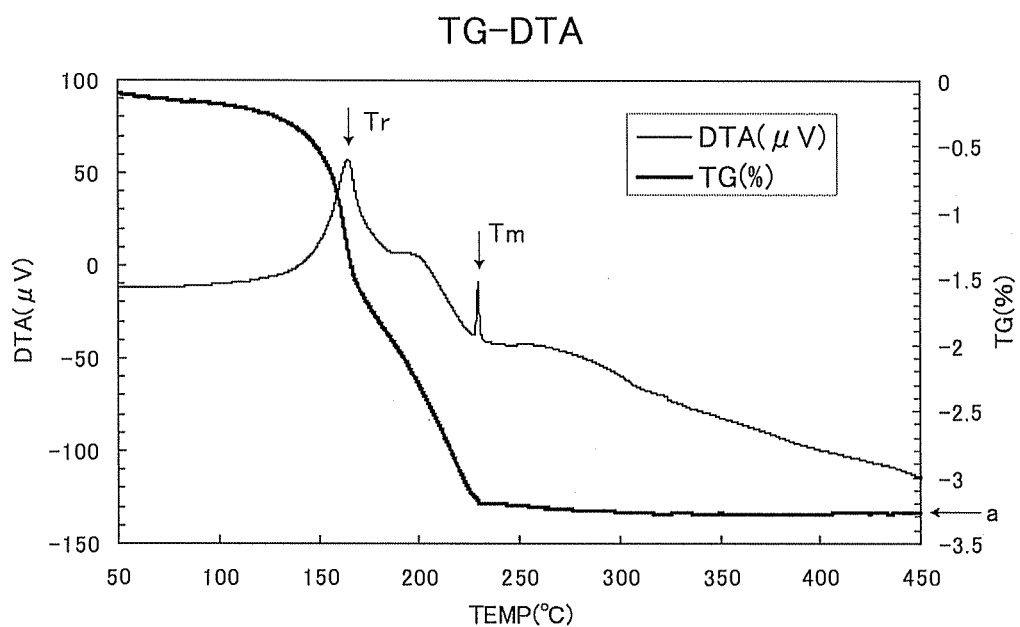
FIG. 3 is a graph diagram showing thermal analysis spectra which is obtained by a thermal analysis of the composite nanosilver particle concerning the present invention under the atmosphere.

FIG. 3 is the graph diagram showing the thermal analysis spectra that the thermal analysis of composite nanosilver particle concerning the present invention is performed under the atmosphere, and the temperature rising rate 5° C./min. The composite nanosilver particle is produced by the method same as the production method described in the patent document 1, and the starting materials are the hexanol and the silver carbonate. Therefore, the organic coating layer derived from hexanol is formed where the carbon number N is not less 6, and is represented by "C6 composite nanosilver particle" as follows. Values of thermogravimetry shown in bold line (represented by "TG (%)" as follows) decrease with rising of temperature, and become constant values at 3.28 mass % shown by the arrow a. Accordingly, the mass ratio of organic coating layer shows becoming 3.28 mass %, and it is guessed that the particle diameter of metal core is larger than 10 nm in the produced composite nanosilver particle. The values described in the Table 1 are the values which are calculated by the model what is the maximum of organic coating group coating the metal core, and even if the mass ratio of organic coating layer is 3.28 mass %, it can be considered that the particle diameter is 5 nm to 10 nm. In addition, due to the change of the reaction temperature and the reaction time, the mass ratio of organic coating layer can be adjusted.

When TG (%) decreases to about 3.2 mass %, in the values (represented by "DTA (μV)" as follows) of the differential thermal analysis measurement indicated by the thin line, peak Tm appears. The peak Tm is an exothermic peak with the metalation of said C6 composite nanosilver particle due to the pyrolysis of organic coating layer. The temperature of peak Tm is named by the pyrolysis temperature. The peak Tr in the DTA (μV) is guessed as an exothermic peak due to beginning the pyrolysis of organic coating layer, but the metalation temperature in which the organic coating layer is completely pyrolyzed is determined by the pyrolysis temperature of peak Tm.

Furthermore, in the composite nanosilver particle which is produced by using the alcohol and the silver carbonate as shown in FIG. 3, the alcohol is selected among methanol having the carbon number N of 1, ethanol having the carbon number N of 2, propanol having the carbon number N of 3, butanol having the carbon number N of 4, pentanol having the carbon number N of 5, hexanol having the carbon number N of 6, heptanol having the carbon number N of 7, octanol having the carbon number N of 8, nonanol having the carbon number N of 9, decanol having the carbon number N of 10, sea urchin decanol having the carbon number N of 11 and dodecanol having the carbon number N of 12, so that it is possible to adjust the carbon number of organic coating group (also described simply by "organic matter") forming the organic coating layer derived from alcohol. The pyrolysis temperature tends to rise with increasing of carbon number N, but depends on the reaction temperature and the reaction time, so that the pyrolysis temperature of composite nanosilver particle is set.

As the composite nanosilver particles concerning the present invention, it is possible to use the composite nanosilver particle produced from the starting materials such as silver nitrate, reducing agent and solvent or the composite nanosilver particle produced from the starting materials such as stearic acid silver, reducing agent and solvent, besides the composite nanosilver particle using the alcohol described above. However, since the reducing agent is not needed, it is preferred to use the composite nanosilver particle produced by using the alcohol, so that it is possible to be produced relatively easily.

Figure 4:
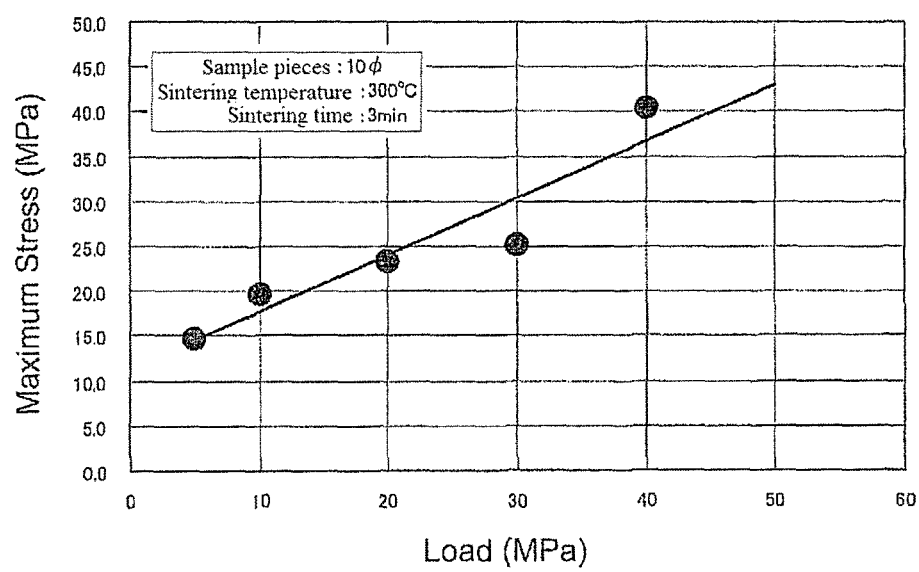
FIG. 4 is a graph diagram showing a pressurization pressure dependence of shear strength where sample pieces of 10 mm$\phi$×10 mm$\phi$ are joined due to the heating and the pressurization for 3 minutes under the atmosphere by using the copper-filler-containing composite nanometal paste concerning the present invention.
Figure 4:
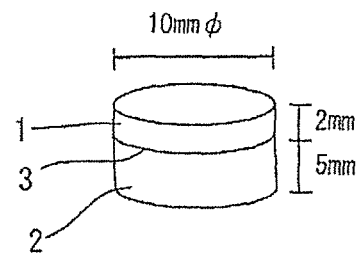

FIG. 4 is the graph diagram showing the pressurization pressure dependence of shear strength where the sample pieces of 10 mmφ×10 mmφ are joined due to the heating and the pressurization for 3 minutes under the atmosphere by using the copper-filler-containing composite nanometal paste concerning the present invention. As inserted in graph diagram below, the joined members comprises first copper specimen 1 in which the diameter is 10 mnφ and the thickness is 2 mm and second copper specimen 2 in which the diameter is 10 mnφ and the thickness is 5 mm, and after the copper-filler-containing composite nanosilver particle is applied between the first copper specimen and the second copper specimen, the pressure sintering with heating is performed for 3 minutes under the atmosphere, and there is measured the shear strength of joining layer 3 in the sintered body which is formed after sintering. The maximum stress (MPa) of joining layer 3 tends to increase linearly with increasing of load (MPa) added during the sintering. When the load is 10 MPa, the maximum stress approximates 20 MPa, the share strength has practical values. When the load is not less than 20 MPa, it is practically preferred that the maximum stress surely exceeds 20 MPa.

TABLE 2

Shear Strength of Joined Members 10 mm φ × 10 mml: Copper Filler (1.5 μm) Content 60 mass %

| Sample Number | Sintering Time (sec) | Sintering Temperature (° C.) | Shear Strength (MPa) |
|---|---|---|---|
| #1 | 180 | 250 | 22.7 |
| #2 | 60 | 300 | 21.7 |
| #3 | 120 | 300 | 29.1 |
| #4 | 180 | 300 | 31.5 |
| #5 | 60 | 350 | 41.6 |
| #6 | 180 | 350 | 49.7 |

In Table 2, when the joined members shown in FIG. 4 are joined by the copper-filler-containing composite nanosilver paste, the share strength (means "the maximum stress" described previously) is measured with changing the sintering time and the sintering temperature. As described previously, the joined members comprises the first copper specimen in which the diameter is 10 mnφ and the thickness is 2 mm and the second copper specimen in which the diameter is 10 mnφ and the thickness is 5 mm, and the load during the pressure sintering is 40 MPa. In addition, the copper-filler-containing composite nanometal paste is produced by the method same as the paste which employed in tests of FIGS. 1 to 3. In the sample #1, the sintering temperature is 250° C. being comparatively low, but the shear strength more than 20 MPa is obtained by heating for 180 sec. In the sample #2, the sintering time is 60 sec being short time, but since the sintering temperature is 300° C., the shear strength more than 20 MPa is obtained. When the sintering temperature is 300° C., in the sample #2 to 4, the shear strength (MPa) increases with increasing of the sintering time. Even if the sintering temperature is 350° C., a tendency similar to the samples #5 and 6 is shown, and it is found that the shear strength becomes more than 40 MPa.

Figure 5:
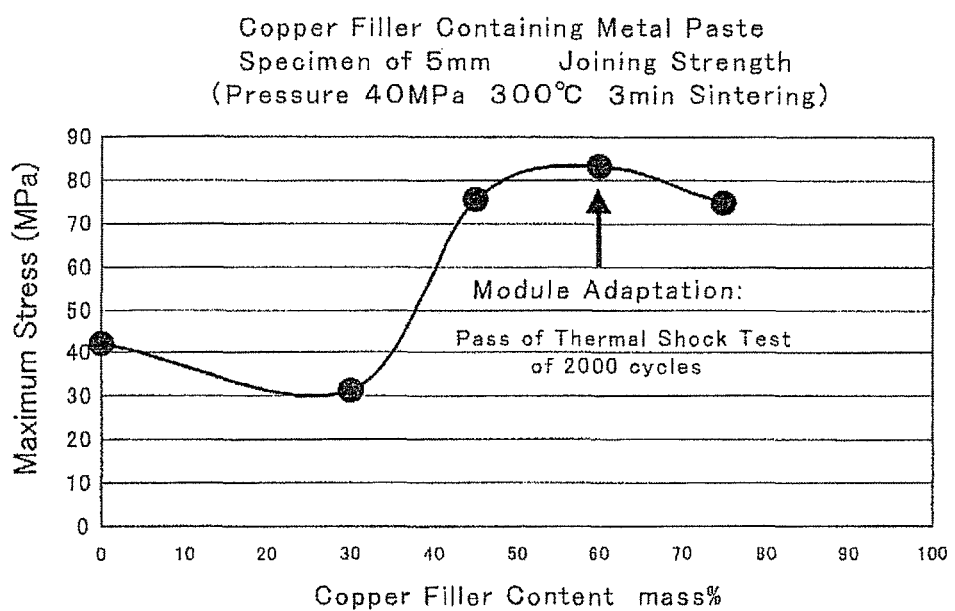
FIG. 5 is a graph diagram showing a copper filler content dependence of shear strength where sample pieces of 5 mm$\phi$×10 mm$\phi$ are joined due to the heating and the pressurization for 3 minutes under the atmosphere by using the composite nanometal pastes which have difference of the copper filler content concerning the present invention.
Figure 5:
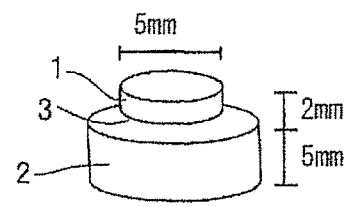

FIG. 5 is the graph diagram showing dependence of the shear strength on the copper filler content where the composite nanometal paste concerning the present invention is used and the sample pieces of 5 mm×10 mm is joined by the pressure sintering with the heating for 3 minutes under the atmosphere. In the pressure sintering, the load is 40 MPa and the sintering temperature is 300° C. The average particle diameter of copper filler is 1.5 μm, and in the composite nanometal paste containing the copper filler, the copper filler content increases from 0 mass % to 75 mass %. When the copper filler content are 45 mass %, 60 mass % and 75 mass %, the maximum stress becomes more than 70 mass %, and then it is found that the strength increases especially. According to the dependence shown in FIG. 5, it is easily found that a preferred range of the copper filler content is 40 mass % to 80 mass %. Actually, in the case more than 80 mass %, it is difficult to produce preferred paste, and it is difficult to obtain the appointed shear strength.

INDUSTRIAL APPLICABILITY

As indicated previously, in the case mass-producing industrially the composite nanometal paste containing the composite nanometal particle which the organic coating layer is formed around the metal core and the copper filler, it is possible to mass-produce the composite nanometal based upon physical quantities which can evaluate a characteristic of the composite nanometal paste. Namely, in the composite nanometal particle, the pyrolysis temperature T of the organic coating layer can be specified by the mass ratio W (mass %) of organic coating layer in the composite nanometal particle which has correlation with respect to the average particle diameter. In other words, according to the mass ratios W1 and W2 of the organic coating layer in the first and the second composite nanometal particles, it is possible to be designed so that the pyrolysis temperature T1 of said first composite nanometal particle and the pyrolysis temperature T2 of said second composite nanometal particle satisfy the relationship T2>T1. Accordingly, since the first composite nanometal particle and the second composite nanometal particle are contained as a binder and the copper filler having a large particle diameter is contained as an aggregate, a strong binding power after sintering is obtained and the total amount of organic matter to the metal ingredient decreases, so that it is possible to provide the composite nanometal paste having a preferable paste characteristic. In other words, in the metal paste, when the total amount of organic matter is set less than the predetermined value, it is possible to obtain the composite nanometal paste having the preferable paste characteristic.

Furthermore, according to the present invention, the copper filler which is comparatively low-priced and have superior thermal conductivity and electrical characteristic is contained with the first and the second composite nanometal particles, and the organic ingredient ratio can be set to relatively low value, so that it is possible to provide the composite nanometal paste which have joining strength and the superior thermal conductivity and electrical characteristic by the sintering in comparatively low temperature and can be produced at low cost.

The present inventors perform production and tests of the composite nanometal paste containing particles formed by copper, zinc, tin or cobalt and a filler which is coated by silver besides the copper filler. However, as to the joining strength, the thermal conductivity and the electrical characteristic besides cost of raw materials, when the copper filler is contained, the composite nanometal paste having the most superior paste characteristic is obtained. Namely, since the first composite nanometal particle and the second nanometal composite particle concerning the present invention are contained and sintered strongly with the copper filler, superiority of copper filler in the superior thermal conductivity and the electrical characteristic is given, and a good result in the thermal shock test. In other words, as a result of intensive researches by the present inventors, it is discovered that the composite nanometal paste containing the first composite nanometal particle, the second composite nanometal particle and the copper filler is a preferable combination in both sides of performance and cost.

In addition, when the pyrolysis temperature and the mass ratio are different as the organic coating layer of composite nanometal particle, it can be used by selecting among carboxylic acid function, alkoxide, other alcohol derivatives and amide group. Especially, the carboxylic acid, the alkoxide and other alcohol derivatives can be comparatively easily produced and in the case that the alcohol solvent and the metal compound are reacted, the reducing agent is unnecessary because the alcohol itself has a reducing function, so that producing process is simplified.

DENOTATIONS OF REFERENCE NUMERALS

1 first copper specimen
2 Second copper specimen
3 Joining layer

The invention claimed is:

1. A copper-filler-containing composite nanometal paste comprising composite nanometal particles in which each particle has an organic coating layer being an organic matter formed around a metal core, and a copper filler which has no organic coating layer,
   wherein said composite nanometal particles comprise at least a first composite nanometal particle with a first organic coating layer thereon and a second composite nanometal particle with a second organic coating layer thereon in which the first and second organic coating layers have different compositions so that pyrolysis temperatures of the first and second organic coating layers differ from each other, and
   wherein, when a mass percent concentration of said organic coating layers in said composite nanometical particles is defined by a term of mass ratio, a mass ratio W1 of said first organic coating layer in said first composite nanometal particle exists within a range of 2 to 13 mass %, and a mass ratio W2 of said second organic coating layer in said second composite nanometal particle exists within a range of 5 to 25 mass %, and
   when T1 is a pyrolysis temperature of said first organic coating layer and T2 is a pyrolysis temperature of said second organic coating layer, relationships of T1<T2 and W1<W2 are satisfied for said first and second composite nanometal particles.

2. The copper-filler-containing composite nanometal paste according to claim 1, wherein a relationship of N1<N2 is satisfied where N1 is a carbon number of said organic matter included in said first composite nanometal particle and N2 is a carbon number of said organic matter included in said second composite nanometal particle.

3. The copper-filler-containing composite nanometal paste according to claim 2, wherein said carbon number N1 is selected from a range of 1 to 6, and said carbon number N2 is selected from a range of 7 to 12.

4. The copper-filler-containing composite nanometal paste according to any one of claims 1 to 3, wherein a metallic element forming said metal core is selected from one or more kinds among Ag, Au, Pt, Ru, Zn, Sn and Ni.

5. The copper-filler-containing composite nanometal paste according to any one of claims 1 to 3, wherein said copper filler is contained in a range of 10 mass % to 90 mass % of total mass of said copper-filler-containing composite nanometal paste.

6. The copper-filler-containing composite nanometal paste according to any one of claims 1 to 3, wherein said organic matter is selected from one or more kinds among an alcohol molecule, a cut residue of an alcohol molecule and an alcohol derivative derived from an alcohol molecule.

7. The copper-filler-containing composite nanometal paste according to any one of claims 1 to 3, wherein an addition agent comprising a viscosity grant agent and/or a viscosity adjustment solvent is added, and an addition amount of said addition agent is determined by a ratio of a total amount of organic matter contained in said composite nanometal particles and a total amount of all metal ingredients contained in said copper-filler-containing composite nanometal paste.

8. The copper-filler-containing composite nanometal paste according to claim 2 or 3, wherein a third composite nanometal particle in which a third organic coating layer comprising an organic matter of carbon number N3 is formed around said metal core is additionally contained, a mass ratio W3 of said third organic coating layer in said third composite nanometal particle is not more than 0.2 mass %; said carbon number N3 satisfies a relationship of N3<N2, and a pyrolysis temperature T3 of said third organic coating layer satisfies a relationship of T3<T2 because of a difference of composition.

9. A joining method comprising the steps of forming a paste layer by applying the copper-filler-containing composite nanometal paste according to any one of claims 1 to 3 between joined members, and sintering said paste layer by heating or heating with pressurization to join said joined members.

10. The joining method according to claim 9, wherein a sinter layer formed by sintering said paste layer absorbs a deformation caused due to difference of thermal expansion coefficients in said joined members.

11. The joining method according to claim 9, wherein said joined members comprise first copper specimen and second copper specimen, and a shear strength with which said first copper specimen and said second copper specimen are joined is not less than 20 MPa, when a joining area of said first copper specimen is the area of a circle with a diameter of 5 mm, a joining area of said second copper specimen is larger than the area of a circle with a diameter of 5 mm, a heating temperature of said heating is not lower than 250° C. and said pressurization is not less than 5 MPa.

* * * * *